US010640868B2

(12) United States Patent
Waki et al.

(10) Patent No.: US 10,640,868 B2
(45) Date of Patent: May 5, 2020

(54) COATED MEMBER

(71) Applicant: Kyocera Corporation, Kyoto-shi, Kyoto (JP)

(72) Inventors: Masahiro Waki, Satsumasendai (JP); Tan Ka, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 126 days.

(21) Appl. No.: 15/569,443

(22) PCT Filed: Apr. 19, 2016

(86) PCT No.: PCT/JP2016/062382
§ 371 (c)(1),
(2) Date: Oct. 26, 2017

(87) PCT Pub. No.: WO2016/175088
PCT Pub. Date: Nov. 3, 2016

(65) Prior Publication Data
US 2018/0209040 A1    Jul. 26, 2018

(30) Foreign Application Priority Data

Apr. 27, 2015 (JP) .................................. 2015-090527
Mar. 28, 2016 (JP) .................................. 2016-064012

(51) Int. Cl.
*C23C 16/02* (2006.01)
*B23P 15/28* (2006.01)
(Continued)

(52) U.S. Cl.
CPC ............ *C23C 16/271* (2013.01); *B23P 15/28* (2013.01); *C23C 16/02* (2013.01); *C23C 16/279* (2013.01);
(Continued)

(58) Field of Classification Search
CPC ...... C23C 16/271; C23C 16/02; C23C 16/279; C23C 16/45523; B23P 15/28;
(Continued)

(56) References Cited

U.S. PATENT DOCUMENTS

2011/0256371 A1* 10/2011 Layyous ............... C23C 14/35
428/216
2012/0051192 A1   3/2012 Steinmuller et al.
(Continued)

FOREIGN PATENT DOCUMENTS

JP   H11100294 A   4/1999
JP   2008019464 A   1/2008
(Continued)

OTHER PUBLICATIONS

International Search Report based on Application No. PCT/JP2016/062382 (2 Pages) dated Aug. 2, 2016 (Reference Purpose Only).

*Primary Examiner* — William K Cheung
(74) *Attorney, Agent, or Firm* — Viering, Jentschura & Partner MBB

(57) ABSTRACT

According to the present disclosure, a coated member is provided with a base material and a diamond layer located on the base material. When a ratio (SP3/SP2) obtainable from an SP3 peak derived from diamond crystals measurable by Raman spectroscopy and an SP2 peak derived from a graphite phase is referred to as an SP3 ratio, an SP3 ratio at a first measuring point with a thickness up to 1 μm extending from an interface of the base material and the diamond layer toward the diamond layer is higher than an SP3 ratio at a second measuring point that is intermediate in a thickness direction of the diamond layer.

15 Claims, 8 Drawing Sheets

(51) Int. Cl.
   *B23B 27/20*    (2006.01)
   *B23B 51/00*    (2006.01)
   *C23C 16/27*    (2006.01)
   *C23C 16/455*   (2006.01)
   *B23B 27/14*    (2006.01)

(52) U.S. Cl.
   CPC ...... *C23C 16/45523* (2013.01); *B23B 27/148* (2013.01); *B23B 27/20* (2013.01); *B23B 51/00* (2013.01); *B23B 2226/31* (2013.01); *B23B 2228/04* (2013.01)

(58) Field of Classification Search
   CPC ....... B23B 27/148; B23B 27/20; B23B 51/00; B23B 2226/31; B23B 2228/04
   USPC ......................................................... 428/323
   See application file for complete search history.

(56) References Cited

U.S. PATENT DOCUMENTS

| | | |
|---|---|---|
| 2012/0068418 A1 | 3/2012 | Hoppe et al. |
| 2019/0134721 A1* | 5/2019 | Waki .................... C23C 16/271 |

FOREIGN PATENT DOCUMENTS

| | | |
|---|---|---|
| JP | 2010202911 A | 9/2010 |
| JP | 2012086317 A | 5/2012 |
| JP | 2012530187 A | 11/2012 |
| KR | 20120014590 A | 2/2012 |
| KR | 20140082838 A | 7/2014 |

* cited by examiner

Wavenumber (cm⁻¹)

COATED MEMBER

RELATED APPLICATIONS

The present application is a national stage entry according to 35 U.S.C. § 371 of PCT application No. PCT/JP2016/062382 filed on Apr. 19, 2016, which claims priority from Japanese application No. 2015-090527 filed on Apr. 27, 2015, and Japanese application No. 2016-064012 filed on Mar. 28, 2016, and are incorporated herein by reference in its entirety.

TECHNICAL FIELD

The present disclosure relates to a coated member including a diamond layer deposited on a surface of a base material.

BACKGROUND ART

Coated members, such as cutting tools, have been known in which a coating layer composed of diamond is deposited on a surface of a base material. For example, Patent Document 1 discloses disposing a diamond coating, which is constituted mainly of SP3 bonding or mixed SP2 bonding and SP3 bonding, by using aerosol deposition method. Patent Document 2 discloses a hard carbon thin film having an inclined structure in which an SP2/SP3 bonding ratio of carbon atoms constituting a thin film decreases from a base side toward a surface side.

RELATED ART DOCUMENTS

Patent Documents

Patent Document 1: Japanese Patent Unexamined Patent Publication No. 2008-19464
Patent Document 2: Japanese Patent Unexamined Patent Publication No. 11-100294

SUMMARY

The coated member including the diamond layer requires improvement of adhesion to the base material and improvement of fracture resistance of the diamond layer.

In an embodiment, a coated member includes a base material and a diamond layer located on the base material. When a ratio (SP3/SP2) obtainable from an SP3 peak derived from diamond crystals measurable by Raman spectroscopy of the diamond layer and an SP2 peak derived from a graphite phase is referred to as an SP3 ratio, an SP3 ratio at a first measuring point with a thickness up to 1 μm extending from an interface of the base material and the diamond layer toward the diamond layer is higher than an SP3 ratio at a second measuring point that is intermediate in a thickness direction of the diamond layer.

EMBODIMENTS

Figure 1:
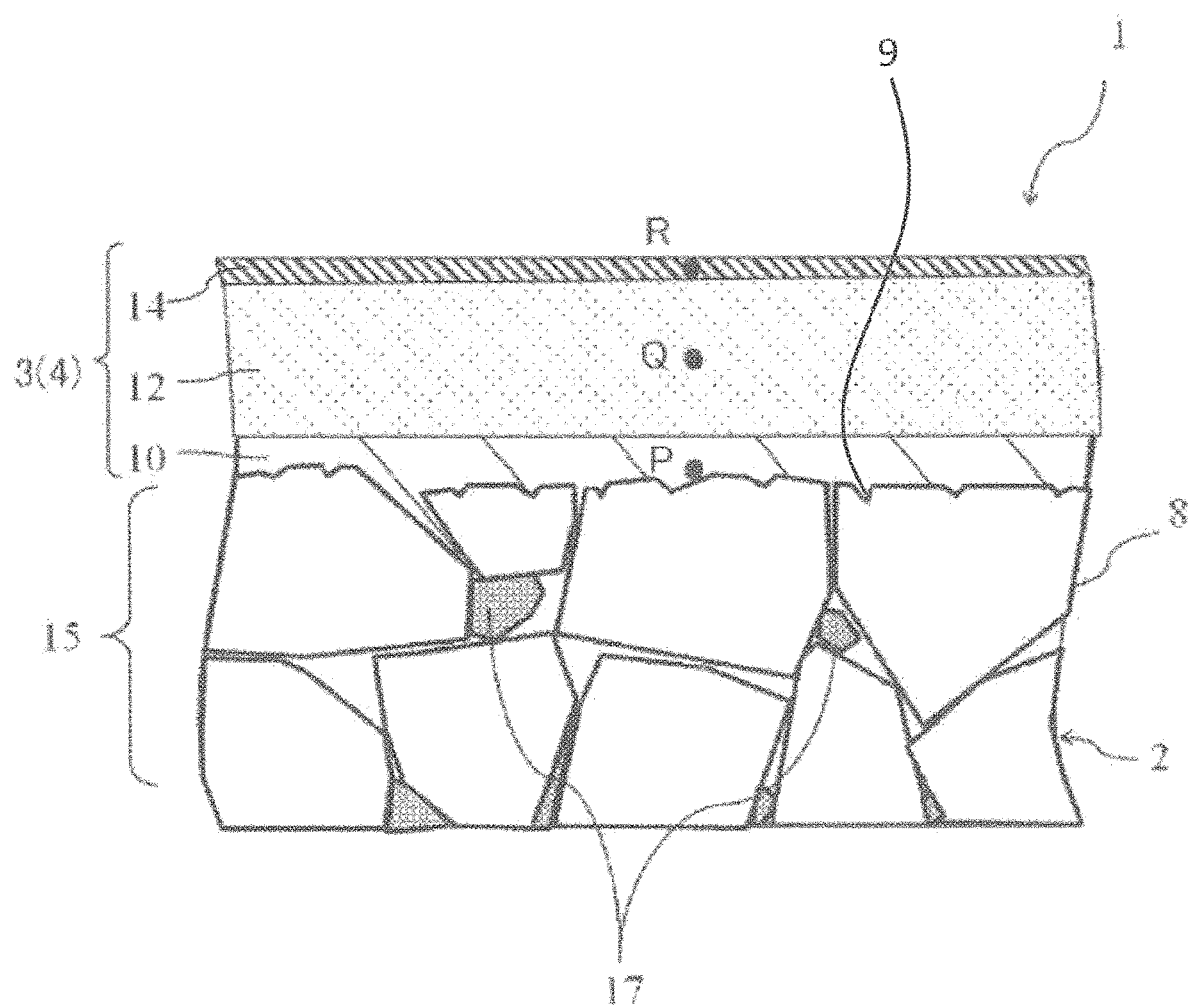
FIG. 1 is a schematic sectional view of an embodiment of a coated member according to the present embodiment.

As shown in a schematic diagram of a cross section in FIG. 1, a coated member 1 of the present embodiment includes a base material 2 and a coating layer 3 located on a surface of the base material 2. The coating layer 3 includes a diamond layer 4 located on the base material 2. Although the coating layer 3 may include another layer other than the diamond layer 4, FIG. 1 shows such an embodiment that the coating layer 3 is composed only of the diamond layer 3.

Figure 2:
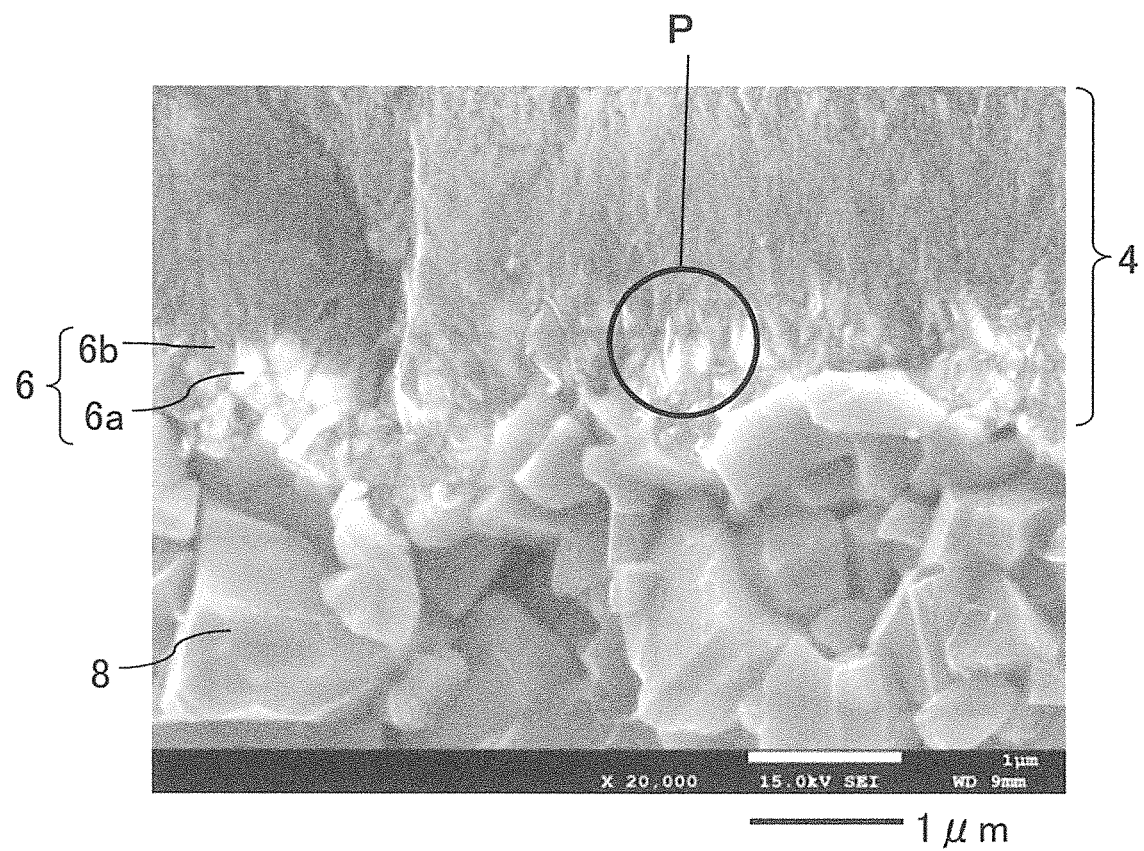
FIG. 2 is a scanning electron microscope photograph that shows a neighborhood of an interface of a base material and a diamond layer in the coated member in FIG. 1.

FIG. 2 is an example of a fracture surface in the coated member 1 of FIG. 1, and is a scanning electron microscope (SEM) photograph that shows an enlarged neighborhood of an interface of the base material 2 and the diamond layer 4. In FIG. 2, the base material 2 is composed of cemented carbide, and a tungsten carbide crystals 8 are observable.

With the present embodiment, when a ratio (SP3/SP2) obtainable from an SP3 peak derived from diamond crystals measurable by Raman spectroscopy of the diamond layer 4 and an SP2 peak derived from a graphite phase is referred to as an SP3 ratio, an SP3 ratio at a first measuring point with a thickness up to 1 μm extending from the interface of the base material 2 and the diamond layer 4 toward the diamond layer 4 is higher than an SP3 ratio at a second measuring point that is intermediate in a thickness direction of the diamond layer 4. The first measuring point is indicated as point "P" and the second measuring point is indicated as point "Q" in FIG. 1. From the viewpoint of a measuring location, an SP3 ratio ($S_1$) at the point P is higher than an SP3 ratio ($S_2$) at the point Q. Thus, at the first measuring point located in the interface of the diamond layer 4 and the base material 2, the diamond layer 4 has high hardness and high automorphic properties, and the diamond layer 4 is therefore less likely to be fractured. Consequently, the diamond layer 4 is less likely to be separated from the base material 2, thereby enhancing adhesion between the base material 2 and the diamond layer 4. The SP3 ratio at the point Q that is the intermediate in the thickness direction of the diamond layer 4 is lower than an SP3 ratio at the first measuring point (point P). Therefore, rigidity of the diamond layer 4 does not become too high, whereas toughness of the diamond layer 4 can be enhanced, thus leading to enhanced fracture resistance of the diamond layer 4.

Figure 3:
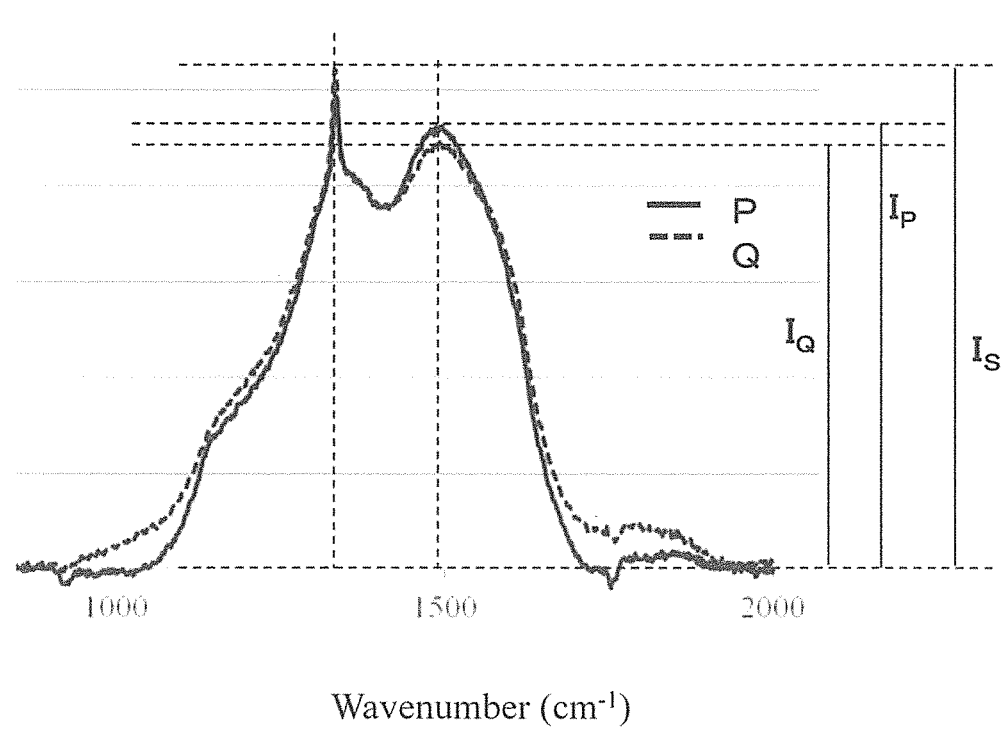
FIG. 3 is Raman spectroscopy data at points P and Q of the coated member in FIG. 1.

In the present embodiment, a measuring region in the Raman spectroscopy has a diameter of 1 μm. The point P indicated by a dot in FIG. 1 is indicated as a circled region in FIG. 2. FIG. 3 shows Raman spectroscopy peaks at the points P and Q. As the Raman spectroscopy peaks, an SP3 peak in the vicinity of 1333 $cm^{-1}$ derived from diamond, and an SP2 peak in the vicinity of 1400-1600 $cm^{-1}$ derived from graphite are observed. In the present embodiment, peak intensity is measured as a highest value of each of the peaks.

A ratio of the peak intensity of the SP3 peak to a sum of the two peak intensities is referred to as an SP3 peak intensity ratio. FIG. 3 shows a comparison of SP2 peaks $I_P$ and $I_Q$ by aligning the SP3 peaks at the points P and Q to an identical value $I_s$.

A thickness of the diamond layer 4 is 2 μm or more in the present embodiment. For example, when the thickness of the diamond layer 4 is 2 μm, a half region on the surface side of the measuring region at the point P, and a half region on the base material 2 side of the measuring region at the point Q are overlappingly measured. Thus, even when the measuring regions are partially overlapped with each other, it is possible to make a relative comparison between the SP3 ratios at the first measuring point P and the second measuring point Q. When the thickness of the diamond layer 4 is 3-20 μm, the diamond layer 4 has high wear resistance and high fracture resistance. A more suitable thickness of the diamond layer 4 is 8-15 μm.

When the SP3 ratio ($S_1$) at the first measuring point P of the diamond layer 4 is 1.1-1.8, and the SP3 ratio ($S_2$) at the second measuring point Q of the diamond layer 4 is 1.0-1.5, the adhesion of the diamond layer 4 to the base material 2 is enhanced, and the fracture resistance of the diamond layer 4 is enhanced.

In FIG. 2, a region indicating the position of the point P is encircled. A boundary of a region, including the point P, in which the tungsten carbide crystals 8 are observable, and the diamond layer 4 located on the region is an interface, and a region which is closer to the diamond layer 4 than the interface and appears white is an interface region 10. A comparison is made in terms of particle diameter in a thickness direction of the diamond crystals 6 constituting the diamond layer 4 in a fracture surface of the base material 2 and the diamond layer 4 as shown in FIG. 2. The comparison shows that the adhesion between the base material 2 and the diamond layer 4 is enhanced when a maximum diamond crystal 6a having a maximum particle diameter exists in the interface region 10. The diamond layer 4 includes an intermediate region 12 on the interface region 10. The intermediate region 12 includes the second measuring point Q.

The interface region 10 exists along the interface of the diamond layer 4 and the base material 2. As shown in FIG. 2, in the diamond crystals 6 constituting the diamond layer 4, a large diamond crystal exists as going in the thickness direction of the diamond layer 4 from the boundary between the diamond layer 4 and the base material 2, and the maximum diamond crystal 6a exists on a side of the interface region 10 which is close to the intermediate region 12. The maximum diamond crystal 6a of the diamond crystals 6 appears white in FIG. 2. The diamond crystals 6 closer to the surface than the maximum diamond crystal 6a is a fine diamond crystal 6b. An interface of the maximum diamond crystal 6a and the fine diamond crystal 6b is a boundary between the interface region 10 and the intermediate region 12.

The interface region 10 exists in a thickness of 0.3-2 μm from the interface with the base material 2. In other words, when the interface region 10 is thinner than 1 μm, on a side of the first measuring point P which is farther from the base material 2, a diamond crystal structure is made up of the intermediate region 12. When the thickness of the interface region 10 is 1 μm, the first measuring point P falls in the same range as the interface region 10. When the interface region 10 is thicker than 1 μm, the entirety of the first measuring point P is included in the interface region 10, and a part of the side farther from the base material 2 than the first measuring point P becomes the interface region 10.

When the thickness of the interface region 10 is 0.3-2 μm, the diamond layer 4 has high wear resistance and high adhesion to the base material 2. When the thickness of the interface region 10 is 0.5-1.0 μm, the diamond layer 4 has higher wear resistance and higher adhesion to the base material 2.

Figure 4:
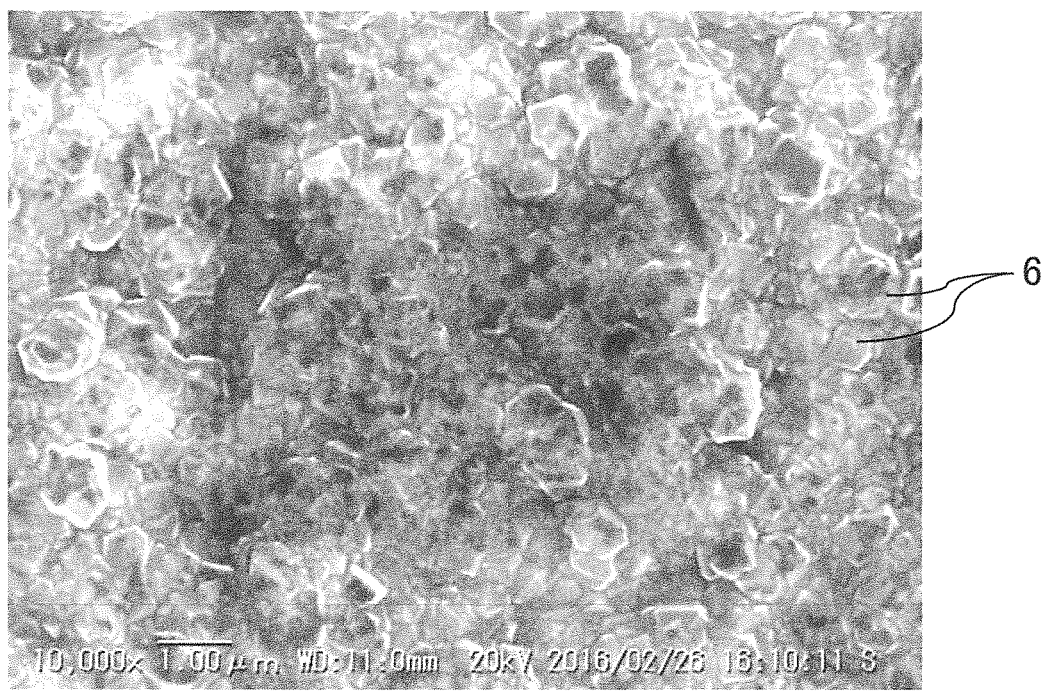
FIG. 4 is a scanning electron microscope photograph viewed toward the diamond layer deposited to a thickness of 0.5 μm in the coated member in FIG. 2.

The interface region 10 includes, besides the maximum diamond crystal 6a, the diamond crystal 6 smaller than the maximum diamond crystal 6a, and the fine diamond crystal 6b which is fractured in a zigzag manner along an idiomorphic surface of the diamond crystal 6 and on which fine irregularities are observed. FIG. 4 shows an SEM photograph of a diamond layer deposited to a thickness of 0.5 μm under the same conditions as deposition conditions at an initial stage for the diamond layer 4 in FIG. 2. As apparent from a comparison between FIGS. 2 and 4, a particle diameter of the diamond crystals 6 looks smaller when viewed on a fracture surface. This is because the diamond crystal 6 has a tetrahedral structure, and in FIG. 4, the tetrahedral large diamond crystal 6 grows into a complicated agglomerated grain with a large number of the fine diamond crystals 6b attached to the surface of the tetrahedral diamond crystal 6.

Adhesion between the base material 2 and the diamond 4 is enhanced when a particle diameter Dd of the maximum diamond crystal 6a is 0.15-0.5 μm in the fracture surface in FIG. 2. As shown in FIG. 2, when a mean particle diameter dW of the tungsten carbide crystals 8 constituting the cemented carbide of the base material 2 is 0.3-1.5 μm, and a ratio (Dd/dW) of the particle diameter Dd of the maximum diamond crystal 6a and the mean particle diameter dW of the tungsten carbide crystal 8 is 0.18-0.4, growth directions of the diamond layer 4 are apt to be easily aligned, thus leading to improved wear resistance and fracture resistance of the diamond layer 4.

As to the particle diameter Dd of the maximum diamond crystal 6a, a contour of each of the diamond crystals 6 in the fracture surface photograph in FIG. 2 is identified, and an area of the maximum diamond crystal 6a having the largest area is converted into a circle. The particle diameter Dd is measurable as a diameter of the circle.

As to the mean particle diameter dW of the tungsten carbide crystal 8, a contour of each of the tungsten carbide crystals 8 in the fracture surface photograph in FIG. 2 is identified, and an average value of areas of the tungsten carbide crystals 8 is converted into a circle. The mean particle diameter dW is measurable as a diameter of the circle. When carrying out this measurement, the measurement is made on the tungsten carbide crystals 8 identifiable in the photograph, excluding the tungsten carbide crystal 8, only part of which is observable in an observation region, and the tungsten carbide crystal 8, at least part of surface of which is coated with the coating layer 3. Specifically, the measurement is made on the fracture surface photograph having a field of vision where ten or more tungsten carbide crystals 8 serve as a measuring object.

As in the SEM photograph of the fracture surface shown in FIG. 2, when the maximum diamond crystal 6a has a longer diameter in the thickness direction of the diamond layer 4, and an aspect ratio is 1.8 or more, separation between the base material 2 and the diamond layer 4 is less likely to occur, thus making it possible to enhance the fracture resistance of the diamond layer 4.

Besides the cemented carbide, a hard material, such as cermet, silicon nitride, aluminum oxide, and cubic boron nitride, and metals, such as stainless steel and high-speed steel, are suitably usable as the base material 2. Of these, the cemented carbide having superior wear resistance and fracture resistance is optimum.

Although not illustrated in the present embodiment, a means particle diameter $d_2$ of the diamond crystals 6 in the intermediate region 12 is preferably in a range of 0.8-3 µm in a polished surface including the base material 2 and the diamond layer 4 in the coated member 1. One method of measuring the mean particle diameter of the diamond crystals 6 is one in which a contour of each of the diamond crystals 6 is identified by displaying orientation of the diamond crystals 6 with the use of color mapping by electron backscatter diffraction (EBSD) method. Another method of measuring the mean particle diameter of the diamond crystals 6 is an observation of the diamond crystals 6 with a transmission electron microscope (TEM). As to the mean particle diameter $d_2$ of the diamond crystals 6 of the intermediate region 12 in the polished surface of the coated member 1, an average value of areas of the diamond crystals 6 is converted into a circle, and the mean particle diameter $d_2$ is measurable as a diameter of the circle. When carrying out this measurement, the measurement is made on the diamond crystals 6 identifiable in the photograph, excluding the diamond crystal 6, part of which extends beyond the photograph, and the diamond crystal 6, at least part of surface of which is coated with the coating layer 3.

When a comparison is made in terms of particle diameter of the diamond crystals 6 in the thickness direction of the diamond layer 4 in the polished surface, a ratio $(d_2/d_1)$ of the mean particle diameter $d_1$ of the diamond crystals in the interface region 10 and the mean particle diameter $d_2$ of the diamond crystals in the intermediate region is 1.0-1.2.

When a main crystal phase 8 constituting the base material 2 located on the interface (the tungsten carbide crystal is the main crystal phase in the present embodiment and therefore bears the same reference numeral "8") has a recess 9 on a surface opposite to the diamond layer 4 in a photograph of a polished cross-section of the coated member 1, it is easy to produce a large number of nuclei of the diamond crystals 6 produced at a point in time when deposition for the diamond layer 4 is started. Additionally, because production density of the diamond crystals 6 is enhanced, the dense diamond layer 4 is formable, thus leading to enhanced adhesion of the diamond layer 4. A depth of the recess 9 of the main crystal phase 8 is, for example, 0.005-0.1 µm. The recess 9 is formable by alkaline etching process described later. From an observation of a cross section including the interface of the base material 2 with the diamond layer 4, the depth of the recess 9 in the main crystal phase 8 is measurable by tracing the surface of the main crystal phase 8 in the base material 2 which is opposite to the diamond layer 4, and calculating, from a locus thereof, a maximum height Rz according to ISO4287 (JISB0601).

In FIGS. 1 and 2, the base material 2 containing the cemented carbide further contains cobalt. The base material 2 has a base material-side interface region 15 extending 0.5-5 µm from the interface. The base material-side interface region 15 is a region of the base material 2, whose cobalt content is lower than a cobalt content at a position 500 µm away from the interface. When depositing the diamond layer 4 on the surface of the base material 2, the presence of cobalt in the surface of the base material 2 contributes to suppressing production of diamond crystals, thereby making it easy to produce graphite. In the present embodiment, by allowing for the presence of the base material-side interface region 15 with a low content of cobalt, cobalt is less likely to exist in the surface of the base material 2, and cobalt is less likely to be produced in the interface region 10 of the diamond layer 4. However, the strength of the base material-side interface region is lowered by eliminating the cobalt in the base material-side interface region 15. In the present embodiment, the cobalt existing in the base material-side interface region 15 exists in a granular shape as indicated by reference numeral 17 in FIG. 1. Thus, a predetermined amount of cobalt is allowed to exist in the base material-side interface region 15, while no cobalt is allowed to exist in the surface of the base material 2. Consequently, strength of the base material-side interface region 15 is less likely to be lowered, and the diamond layer 4 is less likely to separate together with the base material-side interface region 15.

In the present embodiment, granular cobalt particles 17 existing in a granular shape are ones which exist between the main crystal phases 8, and denote ones in a state of allowing a gap or the diamond crystal 6 to exit therebetween. A large gap exists in the base material-side interface region 15 after the alkaline etching. The cobalt diffuses from the interior of the base material 2 into the base material-side interface region 15 during the deposition. On this occasion, the diffused cobalt form a mass due to surface tension, and exists as the granular cobalt particles 17, but does not reach the surface of the base material 2.

Moreover, an interface roughness between the base material 2 and the diamond layer 4 is 0.12-0.8 µm in the present embodiment. When the interface roughness between the base material 2 and the diamond layer 4, namely, a surface roughness of the base material 2 is 0.12 µm or more, nucleation density at the start of deposition for the diamond layer 4 is high, thus leading to enhanced adhesion between the base material 2 and the diamond layer 4. When the interface roughness between the base material 2 and the diamond layer 4, namely, the surface roughness of the base material 2 is 0.8 µm or less, the cobalt in the surface of the base material 2 is completely removable in an etching process for removing the cobalt in the base material-side interface region 15 in the base material 2. This makes it possible to enhance the adhesion between the base material 2 and the diamond layer 4. In the present embodiment, the interface roughness between the base material 2 and the diamond layer 4 is measurable by tracing the interface of the base material 2 with the diamond layer 4 from an observation of a cross section including the interface, and by calculating, from a locus thereof, an arithmetic mean roughness Ry according to ISO4287 (JISB0601). The arithmetic mean roughness Ry is measurable as the interface roughness.

Alternatively, the diamond layer 4 may be made up of two regions of the interface region 10 and the intermediate region 12. Still alternatively, a surface of the intermediate region 12 may include a surface region 14 containing nanocrystal diamond crystals. The nanocrystal diamond crystals are obtainable under the deposition condition of increasing a flow rate of methane gas used during the deposition. An SP3 ratio at a third measuring point R in a range of a thickness of 1 µm from the surface of the diamond layer 4 including the surface region 14 toward the base material 2 is lower than the SP3 ratio at the second measuring point Q. The presence or absence of the nanocrystal diamond crystals is checkable by checking whether there is a peak of the nanocrystal diamonds detectable in the vicinity of 1140 $cm^{-1}$, besides the SP3 peak in a chart obtainable by Raman spectroscopy.

The intermediate region 12 and the surface region 14 are not limited to ones which are divided into two regions having a boundary therebetween, or alternatively, ones in which the peak of the nanocrystal diamond gradually increases. Similarly, the interface region 10 and the intermediate region 12 may be ones which are divided into two regions having a boundary therebetween, or alternatively, ones in which the SP3 peak gradually decreases. In the present embodiment, a position at which the peak of the nanocrystal diamond is detectable is determined as the surface region 14, and a position on a side of the diamond layer 4 close to the base material 2, which has a higher SP3 ratio than the SP3 peak ratio at the second measuring point, is determined as the interface region 10.

A thickness of the surface region 14 is checkable by observing a cross section of the diamond layer 4 with a microscope. When it is difficult to distinguish the interface of individual layers in the microscopic observation, contours of individual particles are checked by displaying the orientation of the diamond crystals in the cross section with the use of color mapping by electron backscatter diffraction (EBSD) method. On this occasion, because the diamond crystals in the surface region 14 have a smaller mean particle diameter than the diamond crystals in the intermediate region 12, the boundary between the surface region 14 and the intermediate region 12 is checkable. Even when the diamond crystals contained in the surface region 14 are made up of nanocrystal diamond crystals whose particle diameter is below resolving power of an EBSD analyzer, the nanocrystal diamond crystals are observable as a neutral color. It is therefore possible to determine, as the interface, the boundary between a color region of the intermediate region 12 and a neutral color region of the surface region 14.

When a thickness of the surface region 14 containing the nanocrystal diamond crystals is 0.1-2 μm in the present embodiment, the diamond layer 4 has a smooth surface to improve slidability of the diamond layer 4.

In the present embodiment, a residual stress at the first measuring point P is a compressive stress, and a residual stress at the second measuring point Q is a tensile stress. This contributes to enhancing the adhesion between the diamond layer 4 and the base material 2, and also suppressing that the diamond layer 4 fractures due to self-destruction even when the diamond layer 4 is thickened. When the diamond layer 4 has the surface region 14, a residual stress at the third measuring point R is a compressive stress, thus leading to enhanced wear resistance of the surface of the diamond layer 4. The residual stress at each of the points P, Q, and R shown in FIG. 1 is checkable by checking a wavenumber at a peak top of the SP3 peak derived from the diamond crystals in the Raman spectroscopy method described above. In other words, a determination can be made that the coating layer 3 is subjected to the tensile stress when the wavenumber at the peak top of the SP3 peak derived from the diamond crystals is smaller than 1333 $cm^{-1}$, and the coating layer 3 is subjected to the compressive stress when the wavenumber at the peak top of the SP3 peak derived from the diamond crystals is larger than 1333 $cm^{-1}$.

Figure 5:
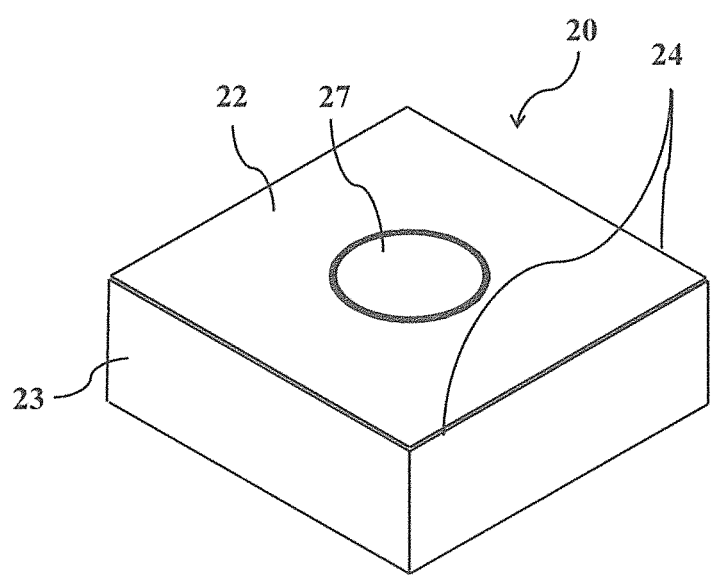
FIG. 5 is a schematic perspective view of an embodiment of a cutting insert that is an embodiment of the coated member of the present embodiment.

FIG. 5 is a schematic perspective view of an embodiment of a cutting insert that is a first embodiment of the coated member of the present embodiment. The cutting insert 20 includes a rake surface on a main surface, a flank surface 23 on a side surface, and a cutting edge 24 along at least part of an intersecting ridgeline of the rake surface 22 and the flank surface 23. The cutting insert 20 also includes a through hole 27 configured to accept a screw, at a middle part of the rake surface 22. The configuration in FIG. 5 is described below, along with the configuration of the coated member 1 shown in FIG. 1. The cutting insert 20 includes the base material 2, and includes, at least in the cutting edge 24, the coating layer 3 including the diamond layer 4 located on the base material 2. Alternatively, when the cutting insert 20 also includes the coating layer 3 on the rake surface 22 and the flank surface 23, the wear resistance in the rake surface 22 and the flank surface 23 is improvable.

Also in the cutting insert 20 that is the first embodiment of the coated member of the present embodiment, an SP3 ratio ($S_1$) at the first measuring point P of the diamond layer 4 in the cutting edge 24 is higher than an SP3 ratio ($S_2$) at the second measuring point Q of the diamond layer 4 in the cutting edge 24. This leads to enhanced adhesion of the diamond layer 4 and enhanced wear resistance of the cutting insert 20. This also leads to enhanced fracture resistance of the diamond layer 4.

Figure 6:
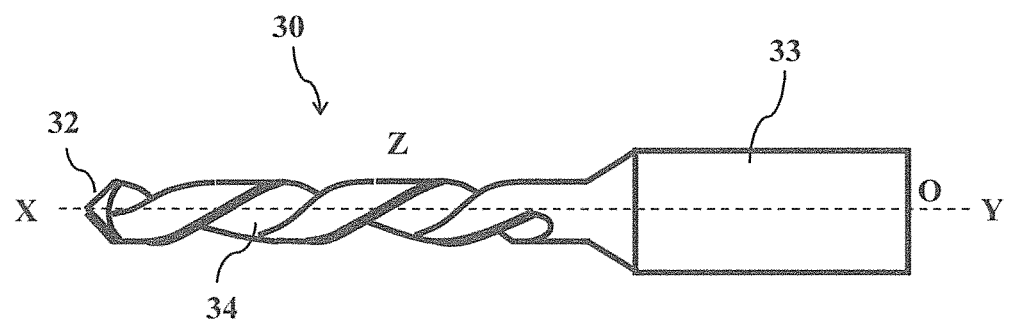
FIG. 6 is a schematic side view of an embodiment of a drill that is another embodiment of the coated member of the present embodiment.

FIG. 6 is a schematic side view of an embodiment of a drill that is a second embodiment of the coated member of the present embodiment. The drill 30 in FIG. 6 has a rod shape having a rotation axis O, and includes a cutting edge 32 disposed on a first end X side, and a chip discharge flute (hereinafter referred to simply as "flute") 34 which extends along the cutting edge 32 and is formed spirally rearward (toward a rear end Y). A shank part 33 is disposed on the second end Y side of the drill 30. The shank part 33 is held by a machining apparatus (not shown), and the drill 30 is attached to the machining apparatus. As used herein, the term "first end X" in the second embodiment denotes the cutting edge 32 side of the rod-shaped drill 30 (cutting tool) in the rotation axis O, and the term "second end Y" denotes the shank part 33 side.

The configuration in FIG. 6 is described below, along with the configuration of the coated member 1 shown in FIG. 1. According to the second embodiment, the drill 30 includes the base material 2, and coating layer 3 is located on the surface of the base material 2. The coating layer 3 is located from the first end X to a location in the vicinity of a terminal end of the flute 34 in the drill 30, and the base material 2 is exposed behind the terminal end.

An outer peripheral side part of the drill 30 may be subjected to a polishing process, such as a brushing process and a blasting process, so as to smoothen the surface of the coating layer 3. Even by doing so, the surface of the flute 34 is hardly polished, and the surface of the coating layer 3 on the flute 34 is hardly smoothened.

With the second embodiment, a thickness (not shown) of the coating layer 3 in the cutting edge 32 located on the first end X side is larger than a thickness of the coating layer 3 in a rear part Z at a position 10 mm away from a front end of the drill 30 toward the second end Y side. Consequently, the coating layer 3 is less likely to be worn out in the cutting edge 32, and it is easy to retain smoothness of the coating layer 3 in the flute 34. A ratio ($t_z/t_x$) of a film thickness $t_x$ (not shown) of the coating layer 3 in the cutting edge 32 and a film thickness $t_z$ (not shown) of the coating layer 3 in the rear part Z at the position 10 mm away from the front end of the drill 30 is preferably in a range of 0.5-0.9, particularly in a range of 0.6-0.9. The film thickness $t_z$ preferably in a range of 5-12 μm.

In the second embodiment, an SP3 ratio ($S_{2e}$) at the second measuring point Q of the diamond layer 4 in the cutting edge 32 is higher than an SP3 ratio ($S_{2g}$) at the second measuring point Q of the diamond layer 4 in the flute 34. Because graphite has better slidability than diamond, it is possible to minimize a cutting resistance of the coating layer 3 in the flute 34 insofar as the above configuration is satisfied. Because graphite is not subject to grain growth, the coating layer 3 has a smaller surface roughness and smoother surface with increasing the content of graphite, thereby further minimizing the cutting resistance of the coating layer 3 in the flute 34. Moreover, because graphite has a lower hardness than diamond, hardness of the coating layer 3 in the flute 34 is lowered, and the surface of the coating layer 3 becomes more smooth at an initial stage of a cutting process, thereby further reducing the cutting resistance of the coating layer 3 on the rotation axis O side that is a central part of the cutting edge 32. On the other hand, the content of diamond with a size in the order of micrometers in the coating layer 3 is high in an outer peripheral part of the cutting edge 32, so that the hardness of the coating layer 3 is improved, and the wear resistance of the coating layer 3 is improved.

An SP3 ratio ($S_{1e}$) at the first measuring point P of the diamond layer 4 in the cutting edge 32 is higher than an SP3 ratio ($S_{1g}$) at the first measuring point P of the diamond layer 4 in the flute 34. That is, because the SP3 ratio at the first measuring point P is low in the flute 34, a content ratio of graphite is high, and the coating layer 3 is apt to be separated. The diamond layer 4 having large irregularities is removed in the flute 34, so that cutting resistance is less likely to increase due to passage of chips.

The thickness of the coating layer 3 in the flute 34 is smaller than the thickness of the coating layer 3 in the cutting edge 32. This contributes to optimizing a surface roughness of the coating layer 3 in the cutting edge 32 and that in the flute 34 prior to the cutting process, thereby being less likely to be subjected to excessive cutting resistance at the initial stage of the cutting process. Alternatively, the surface of the flute 34 may not be provided with the coating layer 3, and the base material 2 may become exposed on the surface of the flute 34 in the second embodiment.

With the second embodiment, a ratio ($t_g/t_x$) of a film thickness $t_x$ (not shown) of the coating layer 3 in the cutting edge 32 and a film thickness $t_g$ of the coating layer 3 in the flute 34 is 0.6-0.9. Thereby, the coating layer 3 is less likely to be worn out in the cutting edge 32, and the smoothness of the coating layer 3 is retainable in the flute 34.

The thickness of the coating layer 3 in the cutting edge 32 denotes a thickness of the coating layer 3 measured at an intermediate position in the cutting edge 32 on a side surface as shown in FIG. 6. When the flute 34 is coated with the coating layer 3, the thickness of the coating layer 3 in the flute 34 denotes a thickness of the coating layer 3 at a deepest portion in the flute 34 in a cross-section vertical to the rotation axis O. The deepest portion in the flute 34 denotes a position in the surface of the base material 2 at the shortest distance from the rotation axis O. A circle passing through the position at the shortest distance around the rotation axis O, namely, a diameter of a maximum circle drawable inside the drill 30 is a core thickness.

Of the coated members of the embodiments, the rod-shaped drill 30 having the rotation axis O has been described in the second embodiment, but without being limited thereto, it is possible to apply to other cutting tools, such as end mills and reamers, as well as wear resistant members, such as sliding members and metal molds.

(Manufacturing Method)

A method for manufacturing the drill that is the foregoing second embodiment is described below.

Firstly, a base material is prepared. For example, when a coated tool is an insert, a sintered body is manufactured by sintering, followed by a polishing process if desired, thereby manufacturing an insert-shaped base material. When the coated tool is a drill, a surface of a cylindrical hard alloy is subjected to a centerless process and then a sharpening process, thereby manufacturing a drill-shaped base material. If desired, a cutting edge side of the base material is subjected to a polishing process.

Subsequently, the surface of the base material is subjected to an etching process, including acid treatment and alkaline treatment. When the alkaline treatment is carried out, a surface of a main crystal phase exposed to the surface of the base material becomes irregular by carrying out the alkaline treatment within an ultrasonic cleaning container. The base material after subjected to the etching is washed with water or the like, and then dried.

When the alkaline treatment is carried out, the surface of the main crystal phase exposed to the surface of the base material 2 becomes irregular by pouring an alkaline solution containing an alkaline aqueous solution and diamond abrasive grains into the ultrasonic cleaning container, followed by application of ultrasound. The base material 2 after subjected to the etching is washed with water or the like, and then dried. On this occasion, the state of the SP3 ratio of the diamond layer is adjustable, and the particle diameter of the diamond crystals in the fracture surface is controllable by controlling, for example, power of the ultrasound applied during the ultrasonic cleaning, and the particle diameter of the diamond abrasive grains, and time for the alkaline treatment.

Subsequently, the diamond layer 4 is deposited on the surface of the base material 2. As a method for depositing the diamond layer 4, a CVD method using a thermal filament method is suitably applicable. An example of the deposition method is described below with reference to FIG. 7. A deposition apparatus 40 shown in FIG. 7 includes a chamber 41, and a sample platform 43 configured to mount samples (the base materials 2 after subjected to the etching) thereon is disposed in the chamber 41. With the present embodiment, the rod-shaped base material 2 is mounted in an upstanding state so that the front end thereof faces upward. A sharpening part (a part including the cutting edge and the chip discharge flute) of the base material 2 is omitted from FIG. 7.

Heaters 44, such as filaments, are disposed around the base materials 2. The heaters 44 are respectively coupled to a power source 45 disposed outside the chamber 41. With the present embodiment, temperatures of the rod-shaped base materials 22 mounted on the sample platform 43 are controlled to 850-930° C. by using a plurality of the heaters 44 while adjusting their arrangement and a current value supplied to each of the heaters 44. The heaters 44 are supported by a support 48.

Figure 7:
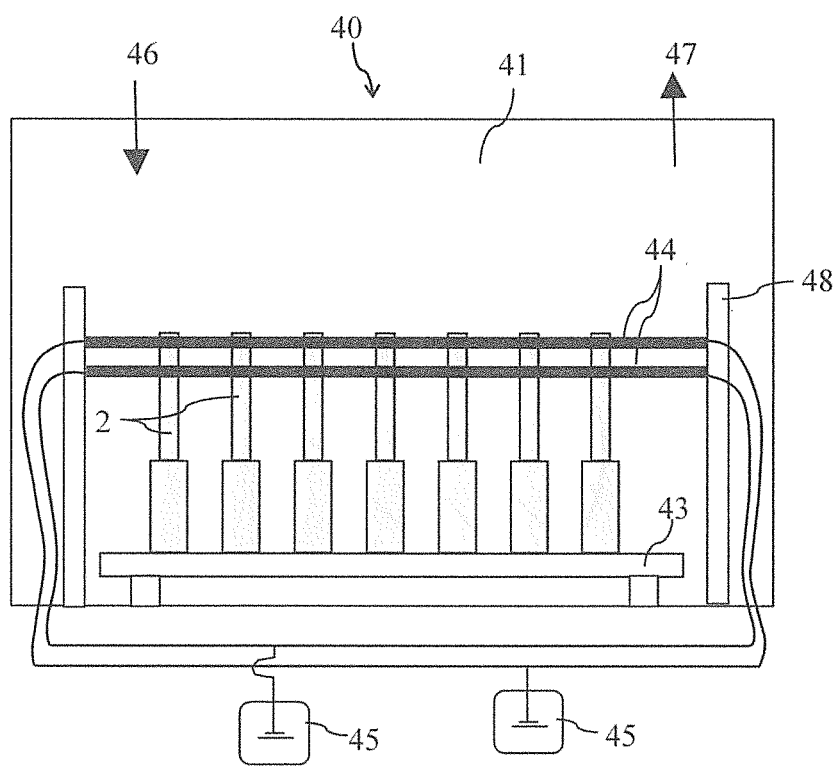
FIG. 7 is a schematic diagram of an embodiment of a deposition process of the diamond layer in the coated member of the present embodiment.
Figure 8:
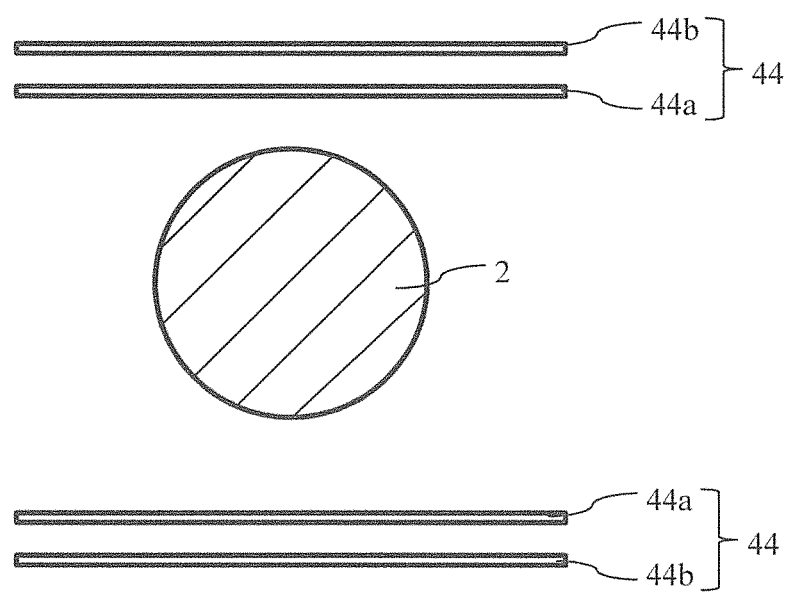
FIG. 8 is a schematic diagram that describes arrangement of heaters in FIG. 7.

The two heaters 44 are disposed in a longitudinal direction of the base materials 2 in FIG. 7. As shown in FIG. 8 that is a sectional view showing the arrangement of the heaters 44 in FIG. 7, the heaters 44 are arranged so as to interpose the base materials 22 therebetween. That is, the four heaters 44 are arranged around the base materials 2.

The chamber 41 is provided with a gas supply port 46 and a gas exhaust port 47. The diamond layer 4 can be deposited by supplying hydrogen gas and methane gas from the gas supply port 46 into the chamber 41 in a vacuum state so as to be sprayed over the base material 2.

As deposition conditions for depositing the diamond layer 4 including the interface region 10 as described above, the following three deposition conditions are employable. Under the first deposition condition, the two heaters 44 (44a and 44b) at different distances from the base materials 2 as shown in FIG. 8 are disposed as a pair of heaters 44. Their respective arrangement and a current value applied to each of the heaters 44 need to be controlled. The current values of the two heaters 44 at different distances from the base materials 2 differ between an initial stage of the deposition and middle and later stages of the deposition. Specifically, the deposition is carried out by activating the heater 44a closer to the base materials to generate heat at the initial stage of the deposition. Then, the heating by the heater 44a closer to the base materials is stopped, and the diamond layer is deposited by activating the heater 44b farther from the base materials to generate heat at the middle and later stages of the deposition. This makes it possible to change the SP3 ratio of the diamond layer 4 deposited on the surface of the base materials 2.

Under the second deposition condition in the present embodiment, the deposition is carried out by increasing a deposition temperature at the initial stage of the deposition for the diamond layer than a deposition temperature at the middle stage of the deposition. Under the third deposition condition in the present embodiment, the deposition is carried out by controlling so that a mixing ratio (% by volume) of methane at the initial stage of the deposition is lower than a mixing ratio of methane at the middle and later stages of the deposition.

Under any one of the first deposition condition, the second deposition condition, and the third deposition condition, an amount of generation of methyl radical generated during the deposition, and a probability that the methyl radical reaches the base material are controllable. The SP3 ratio at the first measuring point P of the diamond layer can be made higher than the SP3 ratio at the second measuring point Q of the diamond layer. Alternatively, the first deposition condition, the second deposition condition, and the third deposition condition may be combined together.

Example 1

An amount of 7.0% by mass of metal cobalt (Co) powder, an amount of 0.8% by mass of chromium carbide ($Cr_3C_2$) powder, and the residual that was tungsten carbide (WC) powder having a mean particle diameter 0.5 μm were added and mixed together. The mixture was molded into a cylindrical shape and sintered. This was subjected to a centerless process and a sharpening process, thereby manufacturing a base material having an end mill shape (the end mill diameter of 6 mm, a core thickness of 3 mm, a cutting edge length of 10 mm, and two-flute).

Thereafter, the base material was subjected to an etching process by sequentially immersing the base material in an acid solution (for 15 minutes in hydrochloric acid) and an alkaline solution (for 5-30 seconds in Murakami Reagent). Some of samples was subjected to processing at power of 100 W in an ultrasonic cleaner for 30 minutes when carrying out an alkaline etching. Thereafter, an end mill base material was manufactured by washing the surface with distilled water.

The base material was then put into the deposition apparatus shown in FIG. 7, and a diamond layer was deposited on a surface of the base material by a thermal filament CVD method. In the deposition apparatus, tungsten filaments with a thickness of 0.4 mmϕ were disposed in a reaction chamber having a diameter of 25 cmϕ and a height of 20 cm. Specifically, two filaments at different distances from the base materials were disposed as a pair of filaments. A total of six filaments were disposed, namely, one pair is disposed on a front end side, and two pairs were disposed on a side surface so as to interpose the base materials therebetween. Deposition temperatures in the interface region, intermediate region, and surface region are presented in Table 1. The end mill-shaped base materials were put in an upright state so that their respective front ends face upward. Then, a diamond layer was deposited by loading, in a vacuum, a reaction gas composition: methane (4% by volume) and hydrogen (residual) from a supply port into a reaction furnace. In Sample No. 1, a methane content ratio at the initial stage of the deposition was set to 2% by volume.

The deposited diamond layer was cut at an intermediate position of a cutting edge length from the front end to a base end of the end mill, and Ramon spectroscopy was carried out at the first measuring point P, the second measuring point Q, and the third measuring point R in a cross section thereof. Then, an SP3 ratio (SP3 strength/(SP3 strength+SP2 strength)) was calculated from a peak strength SP3 of an SP3 peak and peak strength SP2 of an SP2 peak. Further, the diamond layer deposited on the surface of the end mill was subjected to an SEM observation, and a mean particle diameter of diamond crystals in the cutting edge was found with Luzex image analysis method.

Furthermore, a fracture surface of the diamond layer was subjected to an SEM observation to measure a thickness of the interface region and a thickness of the intermediate region. From the SEM observation, the interface between the base material and the diamond layer was traced, and a maximum height Ry was calculated from a locus thereof according to JISB0601. The result was employed as an interface roughness. From an EPMA analysis, an observation was made as to whether the base material-side interface region existed in the surface of the base material of the end mill. A thickness of a region, whose cobalt content was decreased 5% by mass or more than a cobalt content at a depth of 500 μm from the surface of the base material, was estimated. When the base material-side interface region existed, an existence state of cobalt was checked by an TEM analysis, and the presence or absence of granular cobalt existing in a granular shape was checked. The results were presented in Tables 1 to 3.

Cutting performance was evaluated by conducting a cutting test using the obtained end mills under the following cutting conditions. The results were presented in Table 3.
Cutting method: fluting
Work material: CFRP
Cutting speed (feed): 120 mm/min
Feed rate: 0.075 mm/cutting edge
Depth of cut: 8 mm in depth, ϕ6 mm in drilling diameter
Cutting state: under dry condition
Evaluation method: Cutting length and the state of the end mill when it became impossible to machine (indicated as cutting state in Table) were checked.

TABLE 1

| Sample No. | Ultrasonic[1] alkaline etching | Base material | | | Deposition temperature | | | Interface roughness (μm) |
|---|---|---|---|---|---|---|---|---|
| | | Base material-side interface region (μm) | Granular Co | Recess of crystals | Interface region | Intermediate region | Surface region | |
| I-1 | Yes | 3.0 | Present | Present | 900 | 860 | 760 | 0.25 |
| I-2 | Yes | 2.5 | Present | Present | 900 | 880 | 760 | 0.31 |
| I-3 | Yes | 3.5 | Present | Present | 900 | 880 | 700 | 0.35 |
| I-4 | Yes | 1.0 | Present | Present | 900 | 900 | 720 | 0.41 |
| I-5 | No | 1.5 | Present | Absent | 900 | 880 | 760 | 0.20 |
| I-6 | Yes | 4.0 | Absent | Present | 850 | 820 | 650 | 0.79 |
| I-7 | Yes | 2.0 | Present | Present | 900 | 860 | — | 0.47 |
| I-8 | Yes | 5.0 | Absent | Present | 840 | 840 | 760 | 0.88 |
| I-9 | No | 4.5 | Absent | Absent | 860 | 860 | 700 | 0.35 |
| I-10 | No | 2.5 | Present | Absent | 900 | 900 | 700 | 0.35 |

[1] Alkaline etching was carried out with an ultrasonic cleaner at power of 100 w for 30 minutes.

TABLE 2

| Sample No. | SP3 ratio | | | Residual stress (MPa) | | | Mean particle diameter (μm) | | | |
|---|---|---|---|---|---|---|---|---|---|---|
| | $S_1$ | $S_2$ | $S_3$ | $\sigma_1$ | $\sigma_2$ | $\sigma_3$ | $d_1$ | $d_2$ | $d_3$ | $d_2/d_1$ |
| I-1 | 93 | 90 | 65 | −200 | 220 | −300 | 1.40 | 1.60 | 0.09 | 1.14 |
| I-2 | 91 | 89 | 65 | −320 | 220 | −300 | 1.37 | 1.62 | 0.09 | 1.18 |
| I-3 | 90 | 88 | 50 | −250 | 210 | −520 | 1.31 | 1.31 | 0.05 | 1.00 |
| I-4 | 91 | 90 | 40 | −100 | 140 | −240 | 1.90 | 2.20 | 0.06 | 1.16 |
| I-5 | 91 | 89 | 65 | 100 | 220 | −300 | 1.22 | 1.25 | 0.09 | 1.02 |
| I-6 | 85 | 80 | 70 | −100 | −50 | −410 | 0.72 | 0.91 | 0.03 | 1.26 |
| I-7 | 90 | 88 | — | −200 | 200 | — | 1.40 | 1.72 | — | 1.23 |
| I-8 | 84 | 77 | 65 | 300 | 220 | 100 | 0.90 | 0.88 | 0.09 | 0.98 |
| I-9 | 80 | 80 | 40 | 150 | −100 | −800 | 1.57 | 1.54 | 0.05 | 0.98 |
| I-10 | 90 | 90 | 70 | 50 | 100 | −400 | 2.23 | 2.23 | 0.05 | 1.00 |

TABLE 3

| Sample No. | Thickness (μm) | | | Cutting performance | |
|---|---|---|---|---|---|
| | Interface region | Intermediate region | Surface region | Cutting length (m) | Cutting state |
| I-1 | 1.0 | 8.9 | 1.0 | 520 | Steady wear |
| I-2 | 0.8 | 8.9 | 0.8 | 500 | Steady wear |
| I-3 | 1.2 | 8.2 | 1.6 | 490 | Steady wear |
| I-4 | 0.6 | 11.2 | 1.3 | 460 | Steady wear |
| I-5 | 1.5 | 8.9 | 0.7 | 450 | Chipping |
| I-6 | 2.0 | 7.1 | 2.2 | 440 | Steady wear |
| I-7 | 0.4 | 8.7 | — | 420 | Multiple weldings |
| I-8 | 2.5 | 4.8 | 3.0 | 400 | Steady wear |
| I-9 | — | 9.2 | 1.2 | 250 | Peeling |
| I-10 | — | 10.2 | 1.3 | 280 | Fracture |

Tables 1 to 3 show the following results. The fracture resistance of the diamond layer was deteriorated, and a fracture occurred in the cutting edge in Samples Nos. I-9 and I-10 in which the SP3 ratio at the first measuring point P and the SP3 ratio at the second measuring point Q in the diamond layer were the same.

In contrast, the cutting length was long in Samples Nos. I-1 to I-8 which were within the scope of the present invention. In particular, the cutting length was long in Samples Nos. I-1 to I-5 in which a ratio ($d_2/d_1$) was 1.0-1.2.

The cutting length was long in Samples Nos. I-1 to I-4 in which a residual stress at the first measuring point P of the diamond layer was a compressive stress, and a residual stress at the second measuring point Q was a tensile stress. The diamond layer had high adhesion, no chipping was observed in the cutting edge when the cutting was terminated, and a stable cutting was achieved in Samples Nos. I-1 to I-4, and I-6 to I-8 in which the main crystal phase located on an interface of the main crystal phases constituting the base material had a recess on a surface opposite to the diamond layer. The diamond layer had good adhesion, and no abnormal chipping was observed in the cutting edge when the cutting was terminated in Samples Nos. I-1 to I-4, and I-6 to I-8 in which the interface roughness between the base material and the diamond layer was 0.01-0.5 μm, there existed the base material-side interface region whose cobalt content at a depth of 0.5-5 μm from the surface of the base material 5 was less than a content of cobalt at a depth of 500 μm from the surface of the base material, and the cobalt existing in the base material-side interface region existed in a granular shape.

The cutting length was long in Samples Nos. I-1 to 7 in which in the diamond layer, a thickness $t_1$ of the interface region was 0.1-2 μm, and a ratio ($t_2/t_1$) of the thickness $t_1$ of the interface region and a thickness $t_2$ of the intermediate region was 2-50. A large amount of welding was not observed in the cutting edge when the cutting was terminated in Samples No. I-1 to I-6, and I-8 in which the SP3 ratio at the third measuring point R on the surface side of the diamond layer was lower than the SP3 ratio at the second measuring point Q, namely, a third diamond layer with a low SP3 ratio was included.

Example 2

To tungsten carbide (WC) powder having a means particle diameter of 0.5 μm, an amount of 10% by mass of metal cobalt (Co) powder, an amount of 0.2% by mass of titanium carbide (TiC) powder, and an amount of 0.8% by mass chromium carbide ($Cr_3C_2$) powder were added and mixed together. The mixture was molded into a cylindrical shape and sintered. After this was made in a drill shape by being subjected to a centerless machining and a sharpening process, the acid treatment and alkaline treatment were carried out under the same conditions as Example 1. Thereafter, the surface of the base material was washed with distilled water to manufacture a drill base material (a diameter of 6 mm, a cutting edge length of 10 mm, a core thickness of 3 mm, and two-flute). When the alkaline treatment was carried out, an alkaline aqueous solution containing diamond abrasive grains having a means particle diameter of 5 μm was prepared in a container for an ultrasonic cleaner, and the drill base material was immersed therein and treated under conditions for ultrasonic cleaning by using power and time presented in Table 1. The interface roughness of the base material was controlled by changing the centerless machining condition and oxygen processing condition.

A diamond layer was deposited on the surface of the base material by the same deposition apparatus as Example 1. The drill base material was heated to 900° C., and gases were loaded in a vacuum during the deposition, specifically, a reaction gas composition for five minutes at the initial stage: hydrogen (97% by volume) and methane (1% by volume), a reaction gas composition at the middle stage: hydrogen (97% by volume) and methane (3% by volume), and a reaction gas composition at the later stage for ten minutes: hydrogen (97% by volume) and methane (5% by volume). As to the deposited coating layer, measurements were made on an end side and a middle position of the base material of the diamond layer by Raman spectroscopy, and SP3 ratios ($S_{1e}$, $S_{1g}$, $S_{2e}$, $S_{2g}$) were estimated.

As to a fracture surface of the drill, the coating layer was subjected to an SEM observation, and a particle diameter Dd of a maximum diamond crystal, a mean particle diameter dW of diamond carbide crystals, and their ratio (Dd/dW) were found with Luzex image analysis method. Subsequently, a cross section of the coating layer located at a front end of the drill and that at a position 10 mm behind the front end were subjected to an SEM observation, and a thickness of the coating layer was measured. From the SEM observation, the interface between the base material and the diamond layer was traced, and a maximum height Ry was calculated from a locus thereof according to JISB0601. The result was employed as an interface roughness. The base material-side interface region was 3.0 μm by checking similarly to Example 1.

Thicknesses of the interface region, intermediate region, and surface region were measured in the same manner as in Example 1. When the base material-side interface region existed in the base material, an existence state of cobalt existing in the base material-side interface region was checked by an TEM analysis, and the presence or absence of granular cobalt particles was checked. The results were presented in Tables 4 and 5.

Cutting performance was evaluated by conducting a cutting test using the obtained drills under the following cutting conditions. The results were presented in Table 5.
  Cutting method: drilling (through hole)
  Work material: CFRP
  Cutting speed (feed): 100 mm/min
  Feed rate: 0.075 mm/cutting edge
  Depth of cut: 8 mm in depth, φ6 mm in drilling diameter
  Cutting state: under dry condition
  Evaluation method: After drilling 1500 holes, a wear width of the front end of the cutting edge (indicated as wear width in Table), a cutting length causing burr were measured, and the state of the drill when it became impossible to drill was checked.

TABLE 4

| Sample No. | Alkaline etching Power (W) | Alkaline etching Time (minutes) | Interface roughness (μm) | SP3 ratio $S_{1e}$ | SP3 ratio $S_{1g}$ | SP3 ratio $S_{2e}$ | SP3 ratio $S_{2g}$ | Particle diameter (μm) Dd | Aspect ratio | dW | dD/dW |
|---|---|---|---|---|---|---|---|---|---|---|---|
| II-1 | 100 | 60 | 0.45 | 1.2 | 1.0 | 1.0 | 0.9 | 0.30 | 2.3 | 0.8 | 0.38 |
| II-2 | 100 | 30 | 0.35 | 1.3 | 1.1 | 1.0 | 0.8 | 0.26 | 2.0 | 0.8 | 0.33 |
| II-3 | 100 | 20 | 0.31 | 1.2 | 0.9 | 1.0 | 0.7 | 0.20 | 1.9 | 0.8 | 0.25 |
| II-4 | 100 | 15 | 0.25 | 1.1 | 0.9 | 1.0 | 0.7 | 0.17 | 1.8 | 0.8 | 0.21 |
| II-5 | 100 | 10 | 0.20 | 1.1 | 0.8 | 1.0 | 0.7 | 0.15 | 1.8 | 0.8 | 0.19 |
| II-6 | 200 | 30 | 0.88 | 1.2 | 1.1 | 1.0 | 1.0 | 0.34 | 3.1 | 0.8 | 0.43 |
| II-7 | 150 | 30 | 0.55 | 1.2 | 1.0 | 1.0 | 0.9 | 0.33 | 2.2 | 0.8 | 0.41 |
| II-8 | 70 | 30 | 0.10 | 1.0 | 0.7 | 1.0 | 0.5 | 0.13 | 1.3 | 0.8 | 0.16 |
| II-9 | 50 | 30 | 0.05 | 0.8 | 0.6 | 0.8 | 0.6 | 0.08 | 1.0 | 0.8 | 0.10 |
| II-10 | 100 | 5 | 0.05 | 0.8 | 0.6 | 0.8 | 0.6 | 0.09 | 1.0 | 0.8 | 0.11 |
| II-11 | 100 | 5 | 0.35 | 0.9 | 0.6 | 0.9 | 0.6 | 0.09 | 1.0 | 0.8 | 0.11 |

TABLE 5

| Sample No. | Thickness (μm) $t_X$ | Thickness (μm) $t_Z$ | Thickness (μm) $t_g$ | $t_Z/t_X$ | $t_g/t_X$ | Cutting performance Cutting length (m) | Cutting state |
|---|---|---|---|---|---|---|---|
| II-1 | 12.1 | 9.1 | 8.2 | 0.75 | 0.68 | 520 | Steady wear |
| II-2 | 10.0 | 8.5 | 7.5 | 0.85 | 0.75 | 500 | Steady wear |
| II-3 | 9.7 | 6.1 | 7.1 | 0.63 | 0.73 | 490 | Steady wear |
| II-4 | 9.2 | 7.8 | 6.7 | 0.85 | 0.73 | 460 | Steady wear |
| II-5 | 8.5 | 7.5 | 6.2 | 0.88 | 0.73 | 450 | Steady wear |
| II-6 | 14.1 | 8.0 | 10.8 | 0.57 | 0.77 | 440 | Steady wear |
| II-7 | 11.0 | 10.7 | 10.5 | 0.97 | 0.95 | 420 | Chipping |
| II-8 | 7.9 | 7.9 | 7.6 | 1.00 | 0.96 | 400 | Increased wear |
| II-9 | 8.3 | 8.3 | 8.3 | 1.00 | 1.00 | 250 | Peeling |
| II-10 | 8.5 | 8.5 | 8.5 | 1.00 | 1.00 | 280 | Fracture |
| II-11 | 9.1 | 9.1 | 9.1 | 1.00 | 1.00 | 300 | Peeling |

Tables 4 and 5 show the following results. The cutting length was short in Samples Nos. II-9 to II-11 in which the SP3 ratio $S_{1e}$ at the first measuring point P of the diamond layer in the cutting edge was the same as the SP3 ratio $S_{2e}$ at the second measuring point Q.

In contrast, the cutting length was long in Samples Nos. II-1 to II-8 in which the $S_{1e}$ was higher than the $S_{2e}$. In particular, wear resistance was high in Samples Nos. II-1 to II-7 in which the $S_{1e}$ was 1.1-1.8, and the $S_{2e}$ was 1.0-1.5. The cutting length was long in Samples Nos. II-1 to II-6 in which roughness at the interface with the diamond layer was 0.12-0.8 μm.

DESCRIPTION OF THE REFERENCE NUMERAL

1: coated member
 2: base material
 3: coating layer
 4: diamond layer
 6: diamond crystals
 6a: maximum diamond crystal
 6b: fine diamond crystals 8: main crystal phase
10: interface region
12: intermediate region
14: surface region
15: base material-side interface region
17: granular cobalt particles

What is claimed is:

1. A coated member comprising:
   a base material; and
   a diamond layer located over the base material,
   wherein, when a ratio (SP3/SP2) obtainable from an SP3 peak derived from diamond crystals measurable by Raman spectroscopy and an SP2 peak derived from a graphite phase is referred to as an SP3 ratio, an SP3 ratio at a first measuring point with a thickness up to 1 μm extending from an interface of the base material and the diamond layer toward the diamond layer is higher than an SP3 ratio at a second measuring point that is intermediate in a thickness direction of the diamond layer.

2. The coated member according to claim 1, wherein the SP3 ratio at the first measuring point of the diamond layer is 1.1-1.8, and the SP3 ratio at the second measuring point of the diamond layer is 1.0-1.5.

3. The coated member according to claim 1, wherein a residual stress at the first measuring point is a compressive stress, and a residual stress at the second measuring point is a tensile stress.

4. The coated member according to claim 1, further comprising:
   an interface region located between the base material and the main layer, the interface region including the first measuring point,
   wherein the interface region comprises a maximum diamond crystal having a largest particle diameter when, in a fracture surface including the base material and the diamond layer, a comparison is made in terms of particle diameter of diamond crystals in a thickness direction of the diamond layer.

5. The coated member according to claim 4, wherein the interface region exists in a thickness of 0.3-2 μm.

6. The coated member according to claim 4, wherein the maximum diamond crystal in a fracture surface of the diamond layer has a longer diameter in the thickness direction of the diamond layer, and the maximum diamond crystal has an aspect ratio of 1.8 or more.

7. The coated member according to claim 4, wherein a particle diameter of the maximum diamond crystal in a fracture surface of the diamond layer is 0.15-0.5 μm.

8. The coated member according to claim 1, wherein a thickness of the diamond layer is 3-20 μm.

9. The coated member according to claim 4, wherein, when, in a polished surface including the base material and the diamond layer, a comparison is made in terms of particle diameter of diamond crystals in a thickness direction of the diamond layer, a ratio (d2/d1) of a first mean particle diameter d1 of diamond crystals in the interface region and a second mean particle diameter d2 of diamond crystals in an intermediate region over the interface region and including the second measuring point is 1.0-1.2.

10. The coated member according to claim 1, wherein in a polished surface including the base material and the diamond layer, a main crystal phase constituting the base material located in the interface comprises a recess on a surface opposed to the diamond layer.

11. The coated member according to claim 1, wherein the base material contains cobalt, a base material-side interface region extending 0.5-5 μm from the interface has a lower content of the cobalt than at a position 500 μm away from the interface, and the cobalt exists in a granular shape in the base material-side interface region.

12. The coated member according to claim 1, wherein an interface roughness in the interface is 0.12-0.8 μm.

13. The coated member according to claim 1, wherein an SP3 ratio at a third measuring point with a thickness up to 1 μm extending from a surface of the diamond layer is lower than the SP3 ratio at the second measuring point in the diamond layer.

14. The coated member according to claim 13, wherein, when a comparison is made in terms of particle diameter of diamond crystals in a thickness direction of the diamond layer in a polished cross-section including the base material and the diamond layer, a surface region including the third measuring point exists, the surface region comprises smaller diamond crystals than at the second measuring point, and a thickness of the surface region is 0.1-2 μm.

15. The coated member according to claim 1, wherein the diamond layer has a thickness of 2 μm or more.

* * * * *

UNITED STATES PATENT AND TRADEMARK OFFICE
CERTIFICATE OF CORRECTION

PATENT NO. : 10,640,868 B2
APPLICATION NO. : 15/569443
DATED : May 5, 2020
INVENTOR(S) : Masahiro Waki et al.

It is certified that error appears in the above-identified patent and that said Letters Patent is hereby corrected as shown below:

In the Specification

Column 13, Table 1, Column Intermediate region, Row I-2, change '880' to -- 860 --.

Column 13, Table 1, Column Intermediate region, Row I-3, change '880' to -- 860 --.

Column 13, Table 1, Column Intermediate region, Row I-5, change '880' to -- 860 --.

Column 16, Table 4, Column S_2g, Row II-8, change '0.5' to -- 0.6 --.

Signed and Sealed this
Twenty-fifth Day of August, 2020

Andrei Iancu
*Director of the United States Patent and Trademark Office*